(12) United States Patent
Tatani et al.

(10) Patent No.: US 7,420,234 B2
(45) Date of Patent: Sep. 2, 2008

(54) SOLID-STATE IMAGING DEVICE AND METHOD FOR FABRICATING SAME

(75) Inventors: Keiji Tatani, Kanagawa (JP); Hideshi Abe, Kanagawa (JP); Masanori Ohashi, Nagasaki (JP); Atsushi Masagaki, Kanagawa (JP); Atsuhiko Yamamoto, Kanagawa (JP); Masakazu Furukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 11/318,176

(22) Filed: Dec. 23, 2005

(65) Prior Publication Data

US 2006/0197113 A1  Sep. 7, 2006

(30) Foreign Application Priority Data

Jan. 5, 2005  (JP) .............................. 2005-000727

(51) Int. Cl.
*H01L 31/062* (2006.01)
*H01L 31/113* (2006.01)
*H01L 31/0232* (2006.01)

(52) U.S. Cl. ....................................... 257/292; 257/432
(58) Field of Classification Search ......... 257/291–294, 257/431–448
See application file for complete search history.

(56) References Cited

U.S. PATENT DOCUMENTS

| 6,403,998 B1 * | 6/2002 | Inoue ......................... 257/292 |
| 2004/0188597 A1 * | 9/2004 | Inoue et al. ............. 250/214 R |

* cited by examiner

*Primary Examiner*—Cuong Q Nguyen
(74) *Attorney, Agent, or Firm*—Robert J. Depke; Rockey, Depke & Lyons, LLC

(57) ABSTRACT

A solid-state imaging device includes a plurality of pixels two-dimensionally arrayed in a well region disposed on a semiconductor substrate, each pixel including a photoelectric conversion section having a charge accumulation region which accumulates signal charge; an element isolation layer which is disposed on the surface of the well region along the peripheries of the individual charge accumulation regions and which electrically isolates the individual pixels from each other; and a diffusion layer which is disposed beneath the element isolation layer and which electrically isolates the individual pixels from each other, the diffusion layer having a smaller width than that of the element isolation layer. Each charge accumulation region is disposed so as to extend below the element isolation layer and be in contact with or in close proximity to the diffusion layer.

6 Claims, 6 Drawing Sheets

SOLID-STATE IMAGING DEVICE AND METHOD FOR FABRICATING SAME

CROSS REFERENCES TO RELATED APPLICATIONS

The present invention contains subject matter related to Japanese Patent Application JP 2005-000727 filed in the Japanese Patent Office on Jan. 5, 2005, the entire contents of which are incorporated herein by reference.

BACKGROUND OF THE INVENTION

1. Field of the Invention

The present invention relates to a solid-state imaging device in which photoelectric conversion efficiency per unit pixel is improved and to a method for fabricating the solid-state imaging device.

2. Description of the Related Art

In solid-state imaging devices, photoelectric conversion efficiency per unit pixel has been improved by increasing the aperture ratio in the unit pixel or by increasing the light collection efficiency of microlenses.

Recently, in solid-state imaging devices, a further increase in the number of pixels has been taking place, resulting in a decrease in the area per unit pixel, and thus a further improvement in photoelectric conversion efficiency has been desired. Therefore, for example, in the case of a photodiode, in a PN junction structure, the impurity concentrations in the individual regions are increased, and thereby the photoelectric conversion efficiency is improved (refer to Kazuya Yonemoto, "CCD/CMOS imeji sensa no kiso to oyo (Basics and Application of CCD/CMOS Image Sensors)", CQ Publishing Co., Ltd., pp. 92-94).

SUMMARY OF THE INVENTION

However, in the known solid-state imaging devices and fabrication methods therefor, if the impurity concentrations of impurity regions of photoelectric converting elements are increased excessively, defective pixels, such as white spots, occur frequently, resulting in problems.

It is desirable to provide a solid-state imaging device in which photoelectric conversion efficiency per unit pixel can be improved and a method for fabricating such a solid-state imaging device.

According to an embodiment of the present invention, a solid-state imaging device includes a plurality of pixels two-dimensionally arrayed in a well region disposed on a semiconductor substrate, each pixel including a photoelectric conversion section having a charge accumulation region which accumulates signal charge; an element isolation layer which is disposed on the surface of the well region along the peripheries of the individual charge accumulation regions and which electrically isolates the individual pixels from each other; and a diffusion layer which is disposed beneath the element isolation layer and which electrically isolates the individual pixels from each other, the diffusion layer having a smaller width than that of the element isolation layer, wherein each charge accumulation region is disposed so as to extend below the element isolation layer and be in contact with or in close proximity to the diffusion layer.

According to another embodiment of the present invention, in a method for fabricating a solid-state imaging device including a plurality of pixels two-dimensionally arrayed in a well region disposed on a semiconductor substrate, each pixel including a photoelectric conversion section having a charge accumulation region which accumulates signal charge, the method includes the steps of forming an element isolation layer on the surface of the well region, the element isolation layer electrically isolating the individual pixels from each other; forming a diffusion layer so as to surround the individual charge accumulation regions and electrically isolate the individual pixels from each other beneath the element isolation layer; and forming the photoelectric conversion section for each pixel in the well region with the photoelectric conversion sections being electrically isolated from each other by the element isolation layer and the diffusion layer. The photoelectric conversion section formation step includes the substeps of implanting ions of an impurity for forming each charge accumulation region in the well region; and thermally diffusing the impurity implanted in the well region by the ion implantation substep to form each charge accumulation region so that the charge accumulation region extends below the element isolation layer and is brought in contact with or in close proximity to the diffusion layer.

According to another embodiment of the present invention, in a method for fabricating a solid-state imaging device including a plurality of pixels two-dimensionally arrayed in a well region disposed on a semiconductor substrate, each pixel including a photoelectric conversion section having a charge accumulation region which accumulates signal charge, the method includes the steps of forming an element isolation layer on the surface of the well region, the element isolation layer electrically isolating the individual pixels from each other; forming a diffusion layer so as to surround the individual charge accumulation regions and electrically isolate the individual pixels from each other beneath the element isolation layer; and forming the photoelectric conversion section for each pixel in the well region with the photoelectric conversion sections being electrically isolated from each other by the element isolation layer and the diffusion layer. The photoelectric conversion section formation step includes the substeps of implanting first ions of an impurity for forming the charge accumulation region of each photoelectric conversion section in the well region; masking above the charge accumulation region after the first ion implantation substep; and implanting second ions of an impurity that is different from the impurity used in the first ion implantation substep through the element isolation layer in the periphery of each charge accumulation region after the masking substep to form a charge accumulation extension so as to be brought in contact with or in close proximity to the diffusion layer.

According to another embodiment of the present invention, in a method for fabricating a solid-state imaging device including a plurality of pixels two-dimensionally arrayed in a well region disposed on a semiconductor substrate, each pixel including a photoelectric conversion section having a charge accumulation region which accumulates signal charge, the method includes the steps of forming a diffusion layer so as to surround the individual charge accumulation regions and electrically isolate the individual pixels from each other; forming the photoelectric conversion section for each pixel in the well region with the photoelectric conversion sections being electrically isolated from each other by the diffusion layer, the photoelectric conversion section formation step including the substep of implanting ions of an impurity for forming each charge accumulation region in the well region so that the charge accumulation region is brought in contact with or in close proximity to the diffusion layer; and forming an element isolation layer on the surface of the well region after the ion implantation substep, the element isolation layer electrically isolating the individual pixels from each other with the diffusion layer being located therebeneath.

DESCRIPTION OF THE PREFERRED EMBODIMENTS

The solid-state imaging device according to any of the embodiments of the present invention is characterized in that the charge accumulation region of each photoelectric conversion section is formed so as to extend below an element isolation layer and to be brought into contact with or in close proximity to a diffusion layer. Preferably, after the charge accumulation region of the photoelectric conversion section is formed by ion implantation, the charge accumulation region is allowed to extend below the element isolation layer by thermal diffusion. Alternatively, after the charge accumulation region of the photoelectric conversion section is formed by a first ion implantation process, the surface of the well region corresponding to the charge accumulation region surrounded with the element isolation layer is masked, and then ions of an impurity that is different from the impurity used in the first ion implantation process are implanted in the periphery of the charge accumulation region to form a charge accumulation extension region. Alternatively, before the formation of the element isolation layer, the charge accumulation region of the photoelectric conversion section is formed by ion implantation.

In any of such structures, it is possible to increase the charge accumulation region (area) of the photoelectric conversion section in each pixel, and the photoelectric conversion efficiency per unit pixel can be improved.

First Embodiment

A solid-state imaging device and a method for fabricating the same according to a first embodiment will be described below with reference to the drawings.

Figure 1:
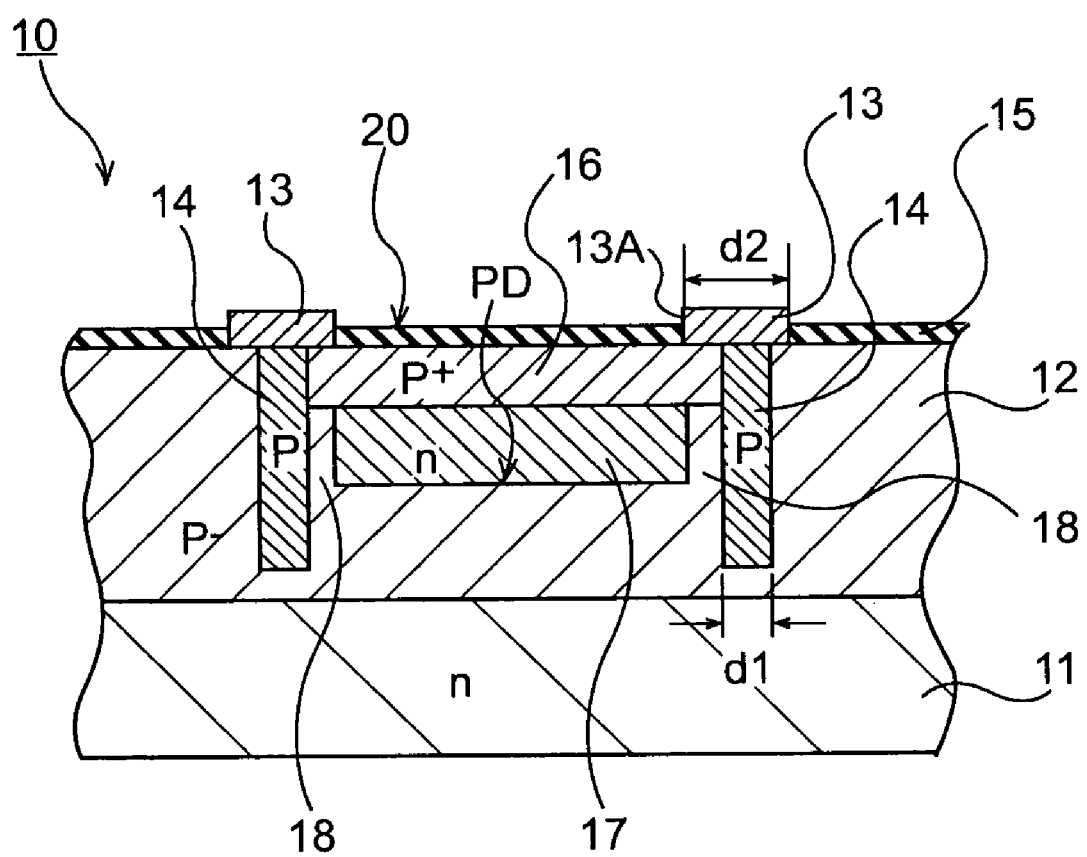
FIG. 1 is a schematic sectional view illustrating a substantial part of a solid-state imaging device and a fabrication process step therefor according to a first embodiment of the present invention.
Figure 2:
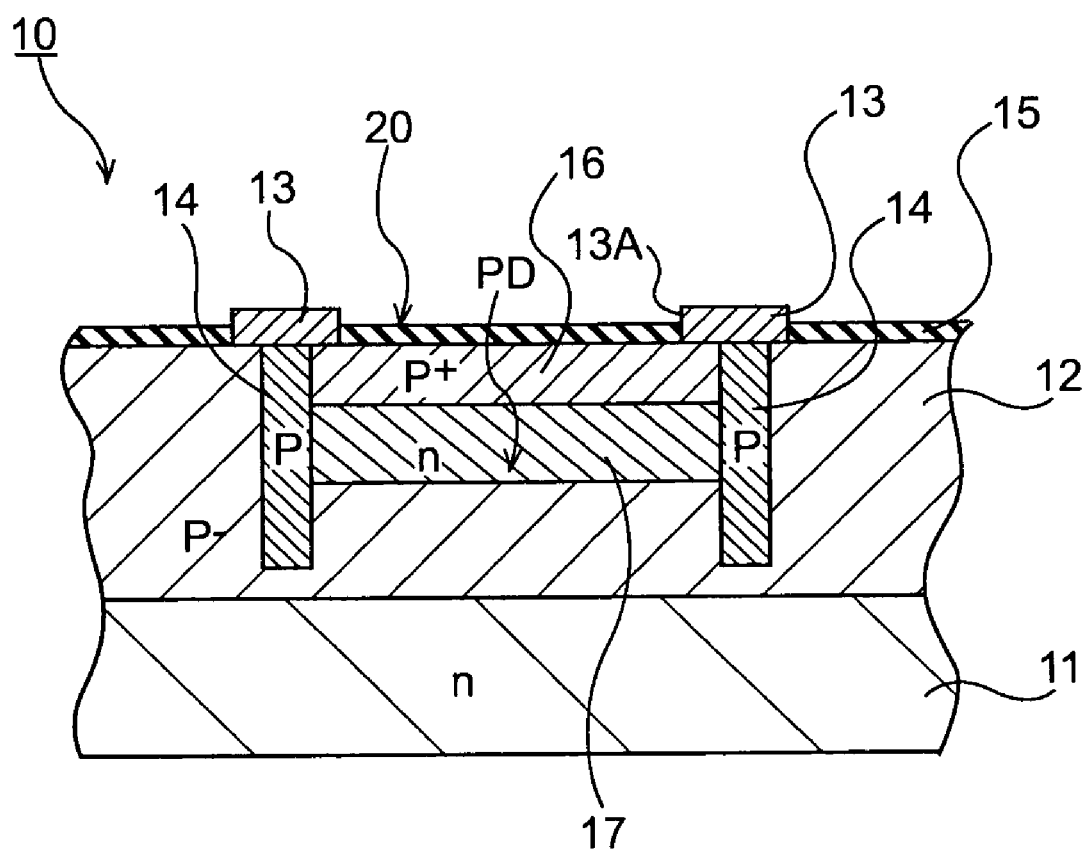
FIG. 2 is a schematic sectional view illustrating a substantial part of the solid-state imaging device and a fabrication process step therefor according to the first embodiment of the present invention.

FIG. 1 is a schematic sectional view illustrating a substantial part of a solid-state imaging device and a fabrication process step therefor according to a first embodiment of the present invention, and FIG. 2 is also a schematic sectional view illustrating a substantial part of the solid-state imaging device and a fabrication process step therefor according to the first embodiment of the present invention.

A solid-state imaging device 10 according to a first embodiment of the present invention includes a semiconductor substrate of a first conductivity type, for example, an n-type silicon substrate 11, and a semiconductor well region of a second conductivity type, for example, a p-type semiconductor well region 12 is disposed on the substrate 11. A plurality of pixels 20 are two-dimensionally arrayed in the p-type semiconductor well region 12, each pixel 20 including a photodiode PD serving as a photoelectric conversion section and a transistor (not shown) for extracting signal charge accumulated in the photodiode PD. An element isolation layer 13 is disposed on the surface of the p-type semiconductor well region 12, the element isolation layer 13 electrically isolating the individual pixels 20 from each other. A p-type diffusion layer 14 is disposed in the well region 12 beneath the element isolation layer 13 so as to surround the individual charge accumulation regions, the diffusion layer 14 electrically isolating the individual pixels 20 from each other. Reference numeral 15 represents an insulating film disposed on the surface of the p-type semiconductor well region 12.

Each photodiode PD includes the p-type semiconductor well region 12 and a first conductivity type, i.e., n-type, charge accumulation region 17 which accumulates signal charge. In this embodiment, the photodiode PD further includes a second conductivity type $p^+$ accumulation layer 16 disposed on the surface of the n-type charge accumulation region 17. Such a photodiode PD constitutes a sensor having a hole accumulation diode (HAD) structure.

In the photodiode PD, the $p^+$ accumulation layer 16 suppresses dark current which is caused by an interface state and results in white spots. The p-type diffusion layer 14 also has a function of isolating the photodiodes PD from each other in the depth direction.

A method for fabricating the solid-state imaging device 10 will now be described with reference to FIGS. 1 and 2.

First, as shown in FIG. 1, a p-type semiconductor well region 12 is formed on an n-type silicon substrate 11. Subsequently, using photolithography, an isolation pattern is formed by patterning on the p-type semiconductor well region 12, the isolation pattern isolating the individual pixels 20 each including a photodiode PD serving as a photoelectric conversion section, and then a p-type diffusion layer 14 is formed by performing ion implantation once or a plurality of times in the depth direction. In such a case, the dosage during the ion implantation is about $1 \times 10^{12}$ cm$^{-2}$, and the width d1 of the p-type diffusion layer 14 is about 0.05 to 10 µm. By setting the width d1 of the p-type diffusion layer 14 in the range described above and as small as allowed by the processing capability so that the width d1 is smaller than the line width d2 of the element isolation layer 13, an extension region 18 is produced in the p-type semiconductor well region 12 below the element isolation layer 13 in the place surrounded with the p-type diffusion layer 14 in each pixel, the extension region 18 substantially enlarging the charge accumulation area of the n-type charge accumulation region 17.

Subsequently, using photolithography, an element isolation pattern is formed by patterning on the surface of the p-type semiconductor well region 12, the element isolation pattern isolating the individual pixels 20 each including the photodiode PD serving as a photoelectric conversion section, and thus an element isolation layer 13, for example, composed of $SiO_2$ is formed. Then, ions are implanted through each opening 13A of the element isolation layer 13 into the p-type semiconductor well region 12, for example, at a dosage of about $1 \times 10^{12}$ cm$^{-2}$. Thereby, an n-type charge accumulation region 17 having an area corresponding to the opening 13A is formed. Subsequently, p-type ions with a high concentration, for example, of $5\times10^{17}$ cm$^{-3}$ or more are implanted in the surface of the n-type charge accumulation region 17, followed by diffusion, and thereby a p$^+$ accumulation layer 16 is formed.

Subsequently, a solid-state imaging device 10 having a structure shown in FIG. 1 is placed in a thermal diffusion furnace (not shown) and heated at a predetermined temperature, for example, in an atmosphere of 900° C., for a predetermined time, for example, about 10 minutes, to thermally diffuse the impurity of the n-type charge accumulation region 17 in the p-type semiconductor well region 12. Thereby, as shown in FIG. 2, the n-type charge accumulation region 17 is enlarged in the depth direction of the photodiode PD and in a direction perpendicular to the depth direction, at least in the direction perpendicular to the depth direction of the photodiode PD so that the peripheral part of the n-type charge accumulation region 17 is in contact with or in close proximity to the p-type diffusion layer 14 below the element isolation layer 13. Here, the term "being in close proximity" means that the n-type charge accumulation region 17 extends toward the p-type diffusion layer 14 by at least half of the width of the extension region 18.

In the solid-state imaging device 10 and the method for fabricating the same according to the first embodiment, in the step of forming the photodiode PD serving as the photoelectric conversion section, after the charge accumulation region 17 of the photodiode PD is formed by ion implantation, the charge accumulation region 17 is allowed to extend below the element isolation layer 13 and brought in contact with or in close proximity to the diffusion layer 14. Therefore, the charge accumulation region 17 can be easily formed also below the element isolation layer 13. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

Second Embodiment

A solid-state imaging device and a method for fabricating the same according to a second embodiment of the present invention will be described below with reference to FIGS. 3 and 4.

Figure 3:
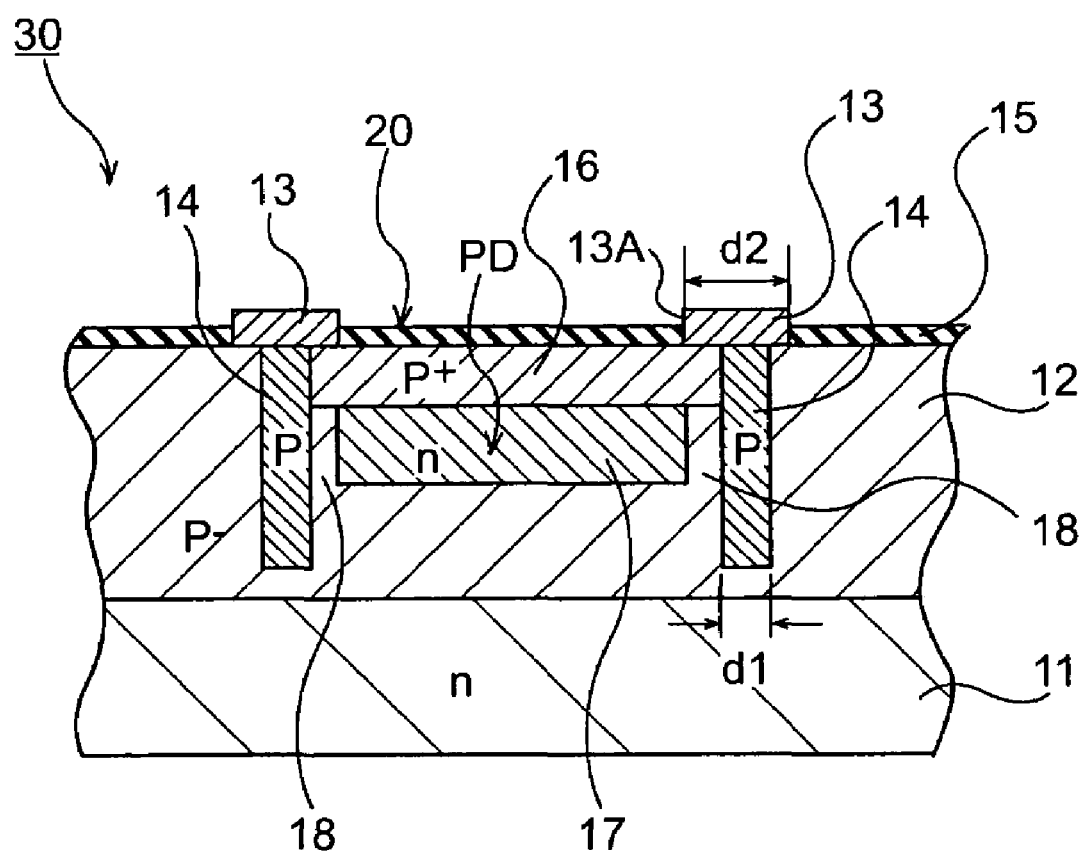
FIG. 3 is a schematic sectional view illustrating a substantial part of a solid-state imaging device and a fabrication process step therefor according to a second embodiment of the present invention.
Figure 4:
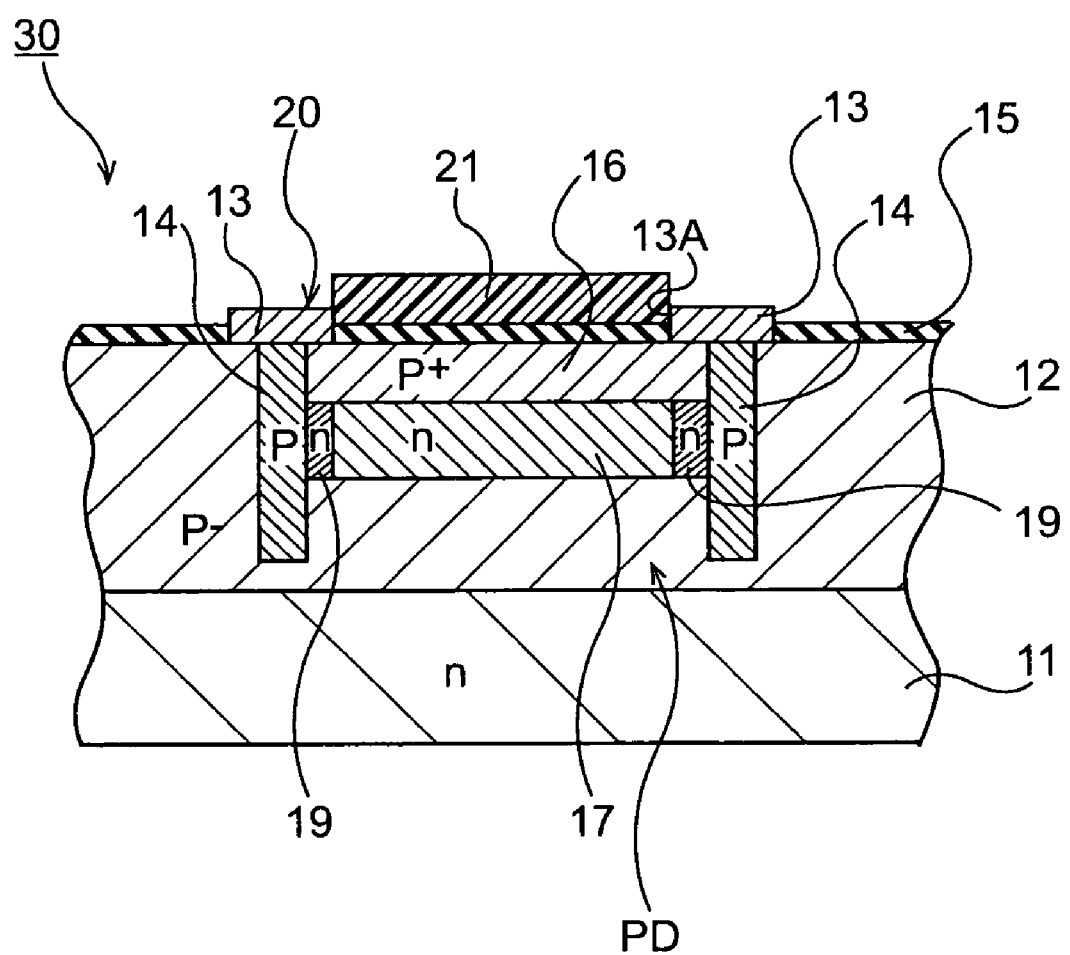
FIG. 4 is a schematic sectional view illustrating a substantial part of the solid-state imaging device and a fabrication process step therefor according to the second embodiment of the present invention.

FIG. 3 is a schematic sectional view illustrating a substantial part of a solid-state imaging device and a fabrication process step therefor according to a second embodiment of the present invention, and FIG. 4 is also a schematic sectional view illustrating a substantial part of the solid-state imaging device and a fabrication process step therefor according to the second embodiment of the present invention.

As in the first embodiment, a solid-state imaging device 30 according to the second embodiment includes a semiconductor substrate of a first conductivity type, for example, an n-type silicon substrate 11, and a semiconductor well region of a second conductivity type, for example, a p-type semiconductor well region 12 is disposed on the substrate 11. A plurality of pixels 20 are two-dimensionally arrayed in the p-type semiconductor well region 12, each pixel 20 including a photodiode PD serving as a photoelectric conversion section. An element isolation layer 13 is disposed on the surface of the p-type semiconductor well region 12, the element isolation layer 13 electrically isolating the individual pixels 20 from each other. A p-type diffusion layer 14 is disposed in the well region 12 beneath the element isolation layer 13 so as to surround the individual charge accumulation regions, the diffusion layer 14 electrically isolating the individual pixels 20 from each other. Reference numeral 15 represents an insulating film disposed on the surface of the p-type semiconductor well region 12.

Each photodiode PD includes the p-type semiconductor well region 12 and a first conductivity type, i.e., n-type, charge accumulation region 17 which accumulates signal charge. In this embodiment, the photodiode PD further includes a second conductivity type p$^+$ accumulation layer 16 disposed on the surface of the n-type charge accumulation region 17. Such a photodiode PD constitutes a sensor having a HAD structure.

In the photodiode PD, the p$^+$ accumulation layer 16 suppresses dark current which is caused by an interface state and results in white spots. The p-type diffusion layer 14 also has a function of isolating the photodiodes PD from each other in the depth direction.

A method for fabricating the solid-state imaging device 30 will now be described with reference to FIGS. 3 and 4.

First, referring to FIG. 3, as in the first embodiment, a p-type semiconductor well region 12 is formed on an n-type silicon substrate 11. Subsequently, using photolithography, an isolation pattern is formed by patterning on the p-type semiconductor well region 12, the isolation pattern isolating the individual pixels 20 each including a photodiode PD serving as a photoelectric conversion section, and then a p-type diffusion layer 14 is formed by performing ion implantation once or a plurality of times in the depth direction. In such a case, the dosage during the ion implantation is about $1\times10^{12}$ cm$^{-2}$, and the width d1 of the p-type diffusion layer 14 is about 0.05 to 10 µm. By setting the width d1 of the p-type diffusion layer 14 in the range described above and as small as allowed by the processing capability so that the width d1 is smaller than the line width d2 of the element isolation layer 13, an extension region 18 is produced in the p-type semiconductor well region 12 below the element isolation layer 13 in the place surrounded with the p-type diffusion layer 14 in each pixel, the extension region 18 substantially enlarging the charge accumulation area of the n-type charge accumulation region 17.

Subsequently, as in the first embodiment, using photolithography, an element isolation pattern is formed by patterning on the surface of the p-type semiconductor well region 12, the element isolation pattern isolating the individual pixels 20 each including the photodiode PD serving as a photoelectric conversion section, and thus an element isolation layer 13, for example, composed of SiO$_2$ is formed. Then, ions are implanted through each opening 13A of the element isolation layer 13 into the p-type semiconductor well region 12, for example, at a dosage of about $1\times10^{12}$ cm$^{-2}$. Thereby, an n-type charge accumulation region 17 having an area corresponding to the opening 13A is formed. Subsequently, p-type ions with a high concentration, for example, of $5\times10^{17}$ cm$^{-3}$ or more are implanted in the surface of the n-type charge accumulation region 17, followed by diffusion, and thereby a p$^+$ accumulation layer 16 is formed.

Subsequently, as shown in FIG. 4, after the ion implantation step for forming the n-type charge accumulation region 17 is completed, the surface region of the photodiode PD corresponding to an opening 13A surrounded by the element isolation layer 13 is masked with a resist film 21. Then, ions of an impurity that is different from the impurity used in the ion implantation for the n-type charge accumulation region 17 are implanted in an extension region 18 between the outer periphery of the n-type charge accumulation region 17 and the inner periphery of the p-type diffusion layer 14 through the element isolation layer 13. Thereby, a charge accumulation extension 19 is formed so as to be brought in contact with or in close proximity to the inner periphery of the p-type diffusion layer 14, the charge accumulation extension 19 substantially enlarging the charge accumulation area of the n-type charge accumulation region 17. Here, the term "being in close proximity" means that the charge accumulation extension 19 extends toward the p-type diffusion layer 14 by at least half of the width of the extension region 18.

In the solid-state imaging device 30 and the method for fabricating the same according to the second embodiment, in the step of forming the photodiode PD serving as the photoelectric conversion section, after the charge accumulation region 17 is formed by ion implantation, the surface region of the photodiode PD corresponding to the opening 13A surrounded by the element isolation layer 13 is masked with the resist film 21, and then ions of an impurity that is different from the impurity used for the n-type charge accumulation region 17 are implanted in the extension region 18 facing the outer periphery of the n-type charge accumulation region 17 to form the charge accumulation extension 19 so as to be brought in contact with or in close proximity to the diffusion layer 14. Therefore, the charge accumulation region 17 can be easily formed also below the element isolation layer 13. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

Third Embodiment

A solid-state imaging device and a method for fabricating the same according to a third embodiment of the present invention will be described below with reference to FIGS. 5 and 6.

Figure 5:
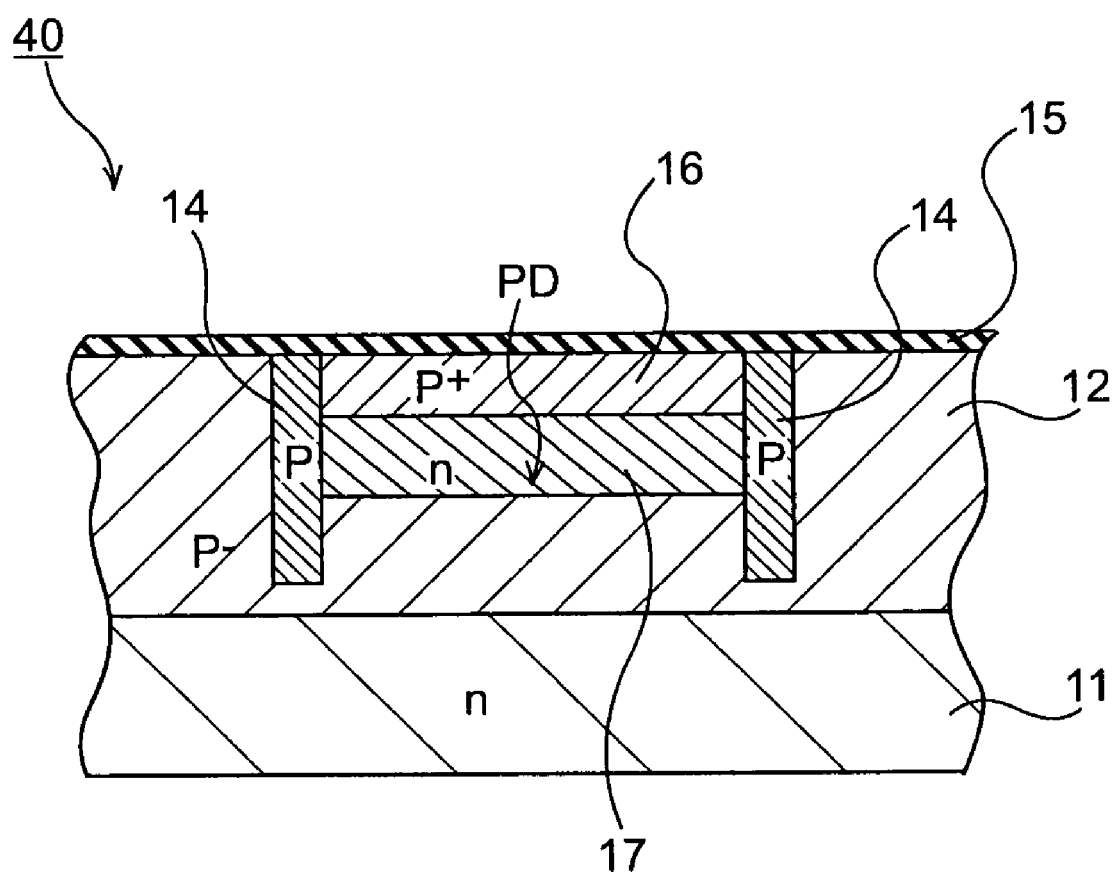
FIG. 5 is a schematic sectional view illustrating a substantial part of a solid-state imaging device and a fabrication process step therefor according to a third embodiment of the present invention.
Figure 6:
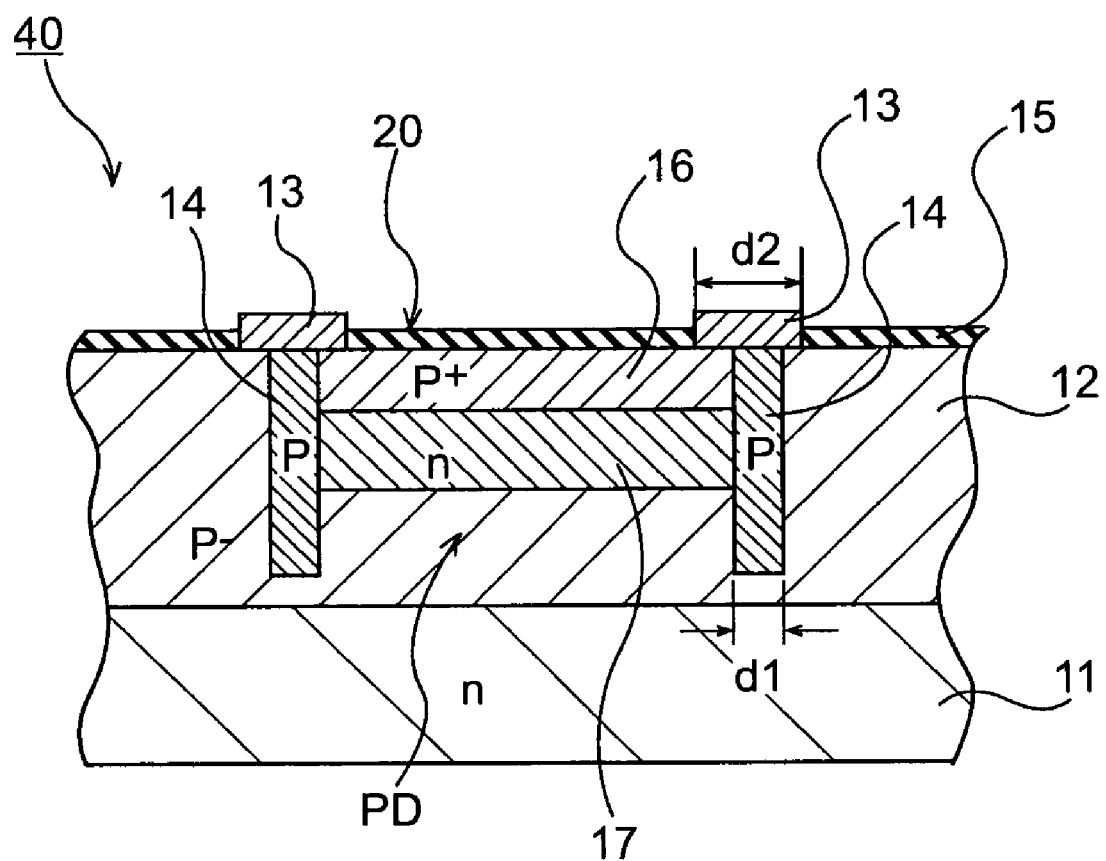
FIG. 6 is a schematic sectional view illustrating a substantial part of the solid-state imaging device and a fabrication process step therefor according to the third embodiment of the present invention.

FIG. 5 is a schematic sectional view illustrating a substantial part of a solid-state imaging device and a fabrication process step therefor according to a third embodiment of the present invention, and FIG. 6 is also a schematic sectional view illustrating a substantial part of the solid-state imaging device and a fabrication process step therefor according to the third embodiment of the present invention.

As in the first embodiment, a solid-state imaging device 40 according to the third embodiment includes a semiconductor substrate of a first conductivity type, for example, an n-type silicon substrate 11, and a semiconductor well region of a second conductivity type, for example, a p-type semiconductor well region 12 is disposed on the substrate 11. A plurality of pixels 20 are two-dimensionally arrayed in the p-type semiconductor well region 12, each pixel 20 including a photodiode PD serving as a photoelectric conversion section. An element isolation layer 13 is disposed on the surface of the p-type semiconductor well region 12, the element isolation layer 13 electrically isolating the individual pixels 20 from each other. A p-type diffusion layer 14 is disposed in the well region 12 beneath the element isolation layer 13 so as to surround the individual charge accumulation regions, the diffusion layer 14 electrically isolating the individual pixels 20 from each other. Reference numeral 15 represents an insulating film disposed on the surface of the p-type semiconductor well region 12.

Each photodiode PD includes the p-type semiconductor well region 12 and a first conductivity type, i.e., n-type, charge accumulation region 17 which accumulates signal charge. In this embodiment, the photodiode PD further includes a second conductivity type $p^+$ accumulation layer 16 disposed on the surface of the n-type charge accumulation region 17. Such a photodiode PD constitutes a sensor having a HAD structure.

In the photodiode PD, the $p^+$ accumulation layer 16 suppresses dark current which is caused by an interface state and results in white spots. The p-type diffusion layer 14 also has a function of isolating the photodiodes PD from each other in the depth direction.

A method for fabricating the solid-state imaging device 40 will now be described with reference to FIGS. 5 and 6.

First, referring to FIG. 5, as in the first embodiment, a p-type semiconductor well region 12 is formed on an n-type silicon substrate 11. Subsequently, using photolithography, an isolation pattern is formed by patterning on the p-type semiconductor well region 12, the isolation pattern isolating the individual pixels 20 each including a photodiode PD serving as a photoelectric conversion section, and then a p-type diffusion layer 14 is formed by performing ion implantation once or a plurality of times in the depth direction. In such a case, the dosage during the ion implantation is about $1 \times 10^{12}$ cm$^{-2}$, and the width d1 of the p-type diffusion layer 14 is about 0.05 to 10 μm. By setting the width d1 of the p-type diffusion layer 14 in the range described above and as small as allowed by the processing capability so that the width d1 is smaller than the line width d2 of the element isolation layer 13, an extension region is produced in the p-type semiconductor well region 12 below the element isolation layer 13 in the place surrounded by the p-type diffusion layer 14 in each pixel, the extension region substantially enlarging the charge accumulation area of the n-type charge accumulation region 17.

Subsequently, ions are implanted at a dosage of about $1 \times 10^{12}$ cm$^{-2}$ in the surface of the p-type semiconductor well region 12 for each pixel before the formation of the element isolation layer 13, and thereby an n-type charge accumulation region 17 having dimensions capable of being in contact with or in close proximity to the inner periphery of the p-type diffusion layer 14 is formed. Subsequently, p-type ions with a high concentration, for example, of $5 \times 10^{17}$ cm$^{-3}$ or more are implanted in the surface of the n-type charge accumulation region 17, followed by diffusion, and thereby a $p^+$ accumulation layer 16 is formed.

Subsequently, using photolithography, an element isolation pattern is formed by patterning on the surface of the p-type semiconductor well region 12, the element isolation pattern isolating the individual pixels 20 each including the photodiode PD serving as a photoelectric conversion section, and thus an element isolation layer 13, for example, composed of SiO$_2$ is formed on the p-type semiconductor well region 12.

In the solid-state imaging device 40 and the method for fabricating the same according to the third embodiment, in the step of forming the photodiode PD serving as the photoelectric conversion section, prior to the formation of the element isolation layer 13, the n-type charge accumulation region 17 having dimensions capable of being in contact with or in close proximity to the inner periphery of the p-type diffusion layer 14 is formed. After the formation of the charge accumulation region 17, the element isolation layer 13 is formed. Therefore, the charge accumulation region 17 can be easily formed also below the element isolation layer 13. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

In each of the first to third embodiments described above, the photodiode PD is used as the sensor having a hole accumulation diode (HAD) structure in which the p+ accumulation layer 16 is disposed on the n-type charge accumulation region 17. However, the present invention is not limited thereto. The photodiode PD may have a structure without the p+ accumulation layer 16.

It should be understood by those skilled in the art that various modifications, combinations, sub-combinations and alterations may occur depending on design requirements and other factors insofar as they are within the scope of the appended claims or the equivalents thereof.

In the solid-state imaging device according to the embodiment of the present invention, since the charge accumulation region of each photoelectric conversion section is disposed so as to extend below the element isolation layer and be in contact with or in close proximity to the diffusion layer, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

In the method for fabricating a solid-state imaging device according to one of the embodiments of the present invention, in the photoelectric conversion section formation step, after the charge accumulation region of each photoelectric conversion section is formed by ion implantation, the charge accumulation region is allowed to extend below the element isolation layer and brought in contact with or in close proximity to the diffusion layer by thermal diffusion. Therefore, the charge accumulation region can be easily formed also below the element isolation layer. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

In the method for fabricating a solid-state imaging device according to one of the embodiments of the present invention, in the photoelectric conversion section formation step, after the charge accumulation region of each photoelectric conversion section is formed by the first ion implantation substep, the surface region of the semiconductor substrate corresponding to each charge accumulation region surrounded with the element isolation layer is masked, and in such a state, ions of an impurity that is different from the impurity used in the first ion implantation substep are implanted in the periphery of the charge accumulation region to form a charge accumulation extension so as to be brought in contact with or in close proximity to the diffusion layer. Therefore, the charge accumulation region can be easily formed also below the element isolation layer. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

In the method for fabricating a solid-state imaging device according to one of the embodiments of the present invention, in the photoelectric conversion section formation step, before the element isolation layer formation step, the charge accumulation region of each photoelectric conversion section is formed by ion implantation, and after the formation of the charge accumulation region, the element isolation layer is formed. Therefore, the charge accumulation region can be easily formed also below the element isolation layer. Consequently, it is possible to increase the charge accumulation region (area) of the photoelectric conversion section in each pixel, and the photoelectric conversion efficiency per unit pixel can be improved. Furthermore, it is not necessary to increase the impurity concentrations of impurity regions of photoelectric converting elements as has been necessary in the past, and thus it is possible to reduce occurrence of defective pixels, such as white spots.

What is claimed is:

1. A solid-state imaging device comprising:
   a plurality of pixels two-dimensionally arrayed in a well region disposed in a semiconductor substrate, each pixel including a photoelectric conversion section having a charge accumulation region which accumulates signal charge;
   an element isolation region which is disposed on the surface of the well region along the peripheries of the individual charge accumulation regions and which electrically isolates the individual pixels from each other;
   a diffusion region which is disposed beneath the element isolation region so as to surround the individual charge accumulation regions and which electrically isolates the individual pixels from each other, the diffusion region having a smaller width than that of the element isolation region,
   wherein at least a portion of each charge accumulation region laterally extends directly below at least a portion of the element isolation region in the horizontal direction.

2. The solid-state imaging device according to claim 1, wherein the photoelectric conversion section includes a hole accumulation region disposed over the charge accumulation region.

3. The solid-state imaging device according to claim 1, wherein the charge accumulation regions extend so as to be brought in contact with or in close proximity to the respective surrounding diffusion region.

4. The solid-state imaging device according to claim 1, wherein the width of said diffusion region is in the range of 0.05 μm to 10 μm.

5. The solid-state imaging device according to claim 1, wherein the element isolation layer does not extend over the entire photoelectric conversion section.

6. The solid-state imaging device according to claim 1, wherein the element isolation layer does not substantially extend into or below the surface of the substrate.

* * * * *